United States Patent
Agostini et al.

(10) Patent No.: US 10,674,630 B2
(45) Date of Patent: Jun. 2, 2020

(54) HEAT EXCHANGE DEVICE BASED ON A PULSATING HEAT PIPE

(71) Applicant: ABB Technology AG, Zürich (CH)

(72) Inventors: Francesco Agostini, Zofingen (CH);
Daniele Torresin, Winterthur (CH);
Bruno Agostini, Dietikon (CH);
Mathieu Habert, Rheinfelden (CH);
Francesco Moraschinelli, Aprica (IT);
Antonello Antoniazzi, Milan (IT)

(73) Assignee: ABB Technology AG, Zurich (CH)

( * ) Notice: Subject to any disclaimer, the term of this patent is extended or adjusted under 35 U.S.C. 154(b) by 119 days.

(21) Appl. No.: 15/089,726

(22) Filed: Apr. 4, 2016

(65) Prior Publication Data

US 2016/0242320 A1   Aug. 18, 2016

Related U.S. Application Data

(63) Continuation of application No. PCT/EP2014/071318, filed on Oct. 6, 2014.

(30) Foreign Application Priority Data

Oct. 4, 2013 (EP) .................................... 13187362

(51) Int. Cl.
*H05K 7/20* (2006.01)
*F28F 9/02* (2006.01)
(Continued)

(52) U.S. Cl.
CPC ..... *H05K 7/20336* (2013.01); *F28D 1/05391* (2013.01); *F28D 15/0266* (2013.01);
(Continued)

(58) Field of Classification Search
CPC ........ F28F 2260/02; F28F 1/325; F28F 1/022; F28F 9/0278; F28D 15/00; F28D 15/0266;
(Continued)

(56) References Cited

U.S. PATENT DOCUMENTS 5,242,016 A * 9/1993 Voss ...................... F25B 39/028
165/173
2005/0284621 A1* 12/2005 Katoh ................. F28D 1/05391
165/174

(Continued)

FOREIGN PATENT DOCUMENTS

DE         10020763 A1   11/2000
DE    102009018116 A1   12/2009
(Continued)

OTHER PUBLICATIONS

PCT/EP2014/071318 Search Report dated Dec. 1, 2014.
(Continued)

*Primary Examiner* — Adam B Dravininkas
(74) *Attorney, Agent, or Firm* — Patterson Intellectual Property Law, P.C.; Gary L. Montle

(57) ABSTRACT

A heat exchange device may be based on a pulsating heat pipe and a cooling arrangement. The heat exchange device may include a plurality of pipes to provide fluid paths between a first fluid distribution element and a second fluid distribution element. Each pipe of the plurality of pipes may include a group of channels. Each of the first and second fluid distribution elements may include a plate of a first type. Each plate of the first type may include openings for providing alignment functionality for the plurality of pipes. The first fluid distribution element may include a plate of a second type that may include openings for providing fluid paths between the pipes. The plate of the second type may be positioned on a side of the plate of the first type of plates
(Continued)

of the first fluid distribution element that is opposite to the second fluid distribution element.

20 Claims, 7 Drawing Sheets

(51) Int. Cl.
| | |
|---|---|
| F28D 1/053 | (2006.01) |
| F28D 15/02 | (2006.01) |
| H01L 23/40 | (2006.01) |
| H01L 23/473 | (2006.01) |
| F28F 1/02 | (2006.01) |
| F28F 1/32 | (2006.01) |
| F28F 3/12 | (2006.01) |
| F28D 21/00 | (2006.01) |

(52) U.S. Cl.
CPC .......... *F28D 15/0275* (2013.01); *F28F 1/022* (2013.01); *F28F 1/325* (2013.01); *F28F 3/12* (2013.01); *F28F 9/0278* (2013.01); *H01L 23/4012* (2013.01); *H01L 23/473* (2013.01); *H05K 7/20927* (2013.01); *F28D 2015/0216* (2013.01); *F28D 2021/0029* (2013.01); *H01L 2924/0002* (2013.01)

(58) Field of Classification Search
CPC ............. F28D 15/0275; F28D 1/05391; F28D 2015/0216; F28D 2021/0029; H05K 7/20336; H05K 7/20927; H01L 23/473; H01L 23/4012; H01L 2924/0002
See application file for complete search history.

(56) References Cited

U.S. PATENT DOCUMENTS

| | | | |
|---|---|---|---|
| 2009/0056916 A1* | 3/2009 | Yesin ................. | F28D 1/05383 165/104.21 |
| 2009/0087640 A1* | 4/2009 | Li ...................... | H05K 7/20981 428/304.4 |
| 2009/0101308 A1* | 4/2009 | Hardesty ............. | F28D 1/035 165/80.4 |
| 2010/0277870 A1* | 11/2010 | Agostini .............. | F28D 1/0435 361/701 |
| 2011/0127011 A1* | 6/2011 | Agostini ............. | F28D 15/0266 165/104.21 |
| 2012/0097369 A1* | 4/2012 | Agostini ............. | F28D 1/05391 165/104.21 |
| 2012/0228757 A1 | 9/2012 | Kitami et al. | |
| 2013/0104592 A1* | 5/2013 | Cottet ................ | H05K 7/20672 62/419 |

FOREIGN PATENT DOCUMENTS

| | | |
|---|---|---|
| EP | 2026028 A2 | 2/2009 |
| EP | 2327947 A1 | 6/2011 |
| EP | 2645040 A1 | 3/2012 |
| EP | 2444770 A1 | 4/2012 |
| EP | 1926961 B1 | 1/2013 |
| EP | 2645040 A1 | 2/2013 |

OTHER PUBLICATIONS

Russian Federal Service for Intellectual Property: Official Action dated Nov. 16, 2018, in co-pending Application No. 2016116755 filed Oct. 6, 2014.
Intellectual Property India: Examination Report dated Jun. 27, 2019 in co-pending Application No. 201647014918 filed Apr. 29, 20196.

* cited by examiner

HEAT EXCHANGE DEVICE BASED ON A PULSATING HEAT PIPE

CROSS-REFERENCES TO RELATED APPLICATIONS

This application is a continuation of and claims priority to and benefit of the following patent applications which are hereby incorporated by reference: EP13187362.2 filed on Oct. 4, 2013, entitled "Heat Exchange Device Based on a Pulsating Heat Pipe" and PCT/EP2014/071318 filed Oct. 6, 2014, entitled "Heat Exchange Device Based on a Pulsating Heat Pipe".

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to a heat exchange device based on a pulsating heat pipe and a cooling arrangement with at least one heat exchange device for cooling electronic components.

In EP 2444 770 A1 a heat exchange device based on pulsating heat pipe is disclosed. The heat exchange device comprises evaporator channels and condenser channels extending between a first and a second end of the heat exchange device. A first heat transfer element is arranged in a vicinity of the first end of the heat exchange device for transferring a heat load to a fluid in said evaporator channels. Similarly, a second heat transfer element is arranged in a vicinity of the second end of the heat exchange device for transferring a heat load from a fluid in said condenser channels to a further cooling media for example air. The heat exchange device comprises a first fluid distribution element on the first end of the connecting parts and a second fluid distribution element on the second end of the connecting parts. The first and the second distribution element conduct fluid from one or more predetermined channels of a first group of channels into one or more predetermined channels of a second group of channels. Each of the first and the second fluid distribution element comprising at least one plate providing a connection between the first group and the second group of adjacent channels. The heat exchange device according to EP 2444 770 A1 has the following disadvantages: It is expensive to produce due to the use of too many parts. Further, it has only a limited heat performance.

Therefore, it is an object of the present invention to provide a heat exchange device that is easier to manufacture and to reduce its production costs. It is a further object to provide a heat exchange device with an improved heat performance. A further technical objective is to provide an improved heat exchange device whose cooling properties can be easily adapted to different cooling requirements depending on the field of application and on the electronic components that need to be cooled. A further objective of the present invention is to provide a heat exchange device that works orientation free meaning that the heat exchange device works independently from its orientation, so the heat exchange device is adaptable to different cooling requirements.

BRIEF SUMMARY OF THE INVENTION

The technical object is achieved by the subject-matter of the independent claims. Further exemplary embodiments are evident from the dependent claims and the following description.

According to an aspect of the present invention, a heat exchange device is proposed. The heat exchange device is based on a pulsating heat pipe comprising a plurality of pipes to provide fluid paths between a first fluid distribution element and a second fluid distribution element of the heat exchange device. Each pipe of the plurality of pipes comprises a group of channels. Each of the first fluid distribution element and the second fluid distribution element comprises at least a plate of a first type, wherein each of the plates of the first type comprises openings for providing an alignment functionality for the plurality of pipes, and wherein the plates of the first type have an identical thickness. The first fluid distribution element comprises a plate of a second type, and wherein the plate of the second type comprises openings for providing fluid paths between the plurality of pipes. The plate of the second type is positioned on a side of the plate of the first type of the first fluid distribution element that is opposite to the second fluid distribution element.

The heat exchange device of the present invention has the advantage that it is easier to manufacture and that its production costs are decreased, because a fewer number of different parts are necessary.

The heat exchange device is applicable for cooling electronic devices in a wide range of technical fields for example for switchgear and/or drives used in low and medium voltage applications. The term "medium voltage" mentioned above is understood as a rated voltage of about 1000 Volts up to about 36000 Volts (DC, or rms voltage in case of AC). A voltage below 1000 Volts is regarded hereinafter as "low voltage".

The heat exchange device of the present invention can be used for cooling a single electronic device such as a power semiconductor device which is mounted on the heat exchange device. However, it also possible to stack a plurality of heat exchange devices for cooling a plurality of semiconductor devices.

A further advantage of the improved heat exchange device is that the heat exchange device works in any orientation.

Another advantage of the present invention is that the heat exchange device can preferably be cooled by air. However, other cooling media may be used such as water or oil.

DETAILED DESCRIPTION OF THE INVENTION

Figure 1:
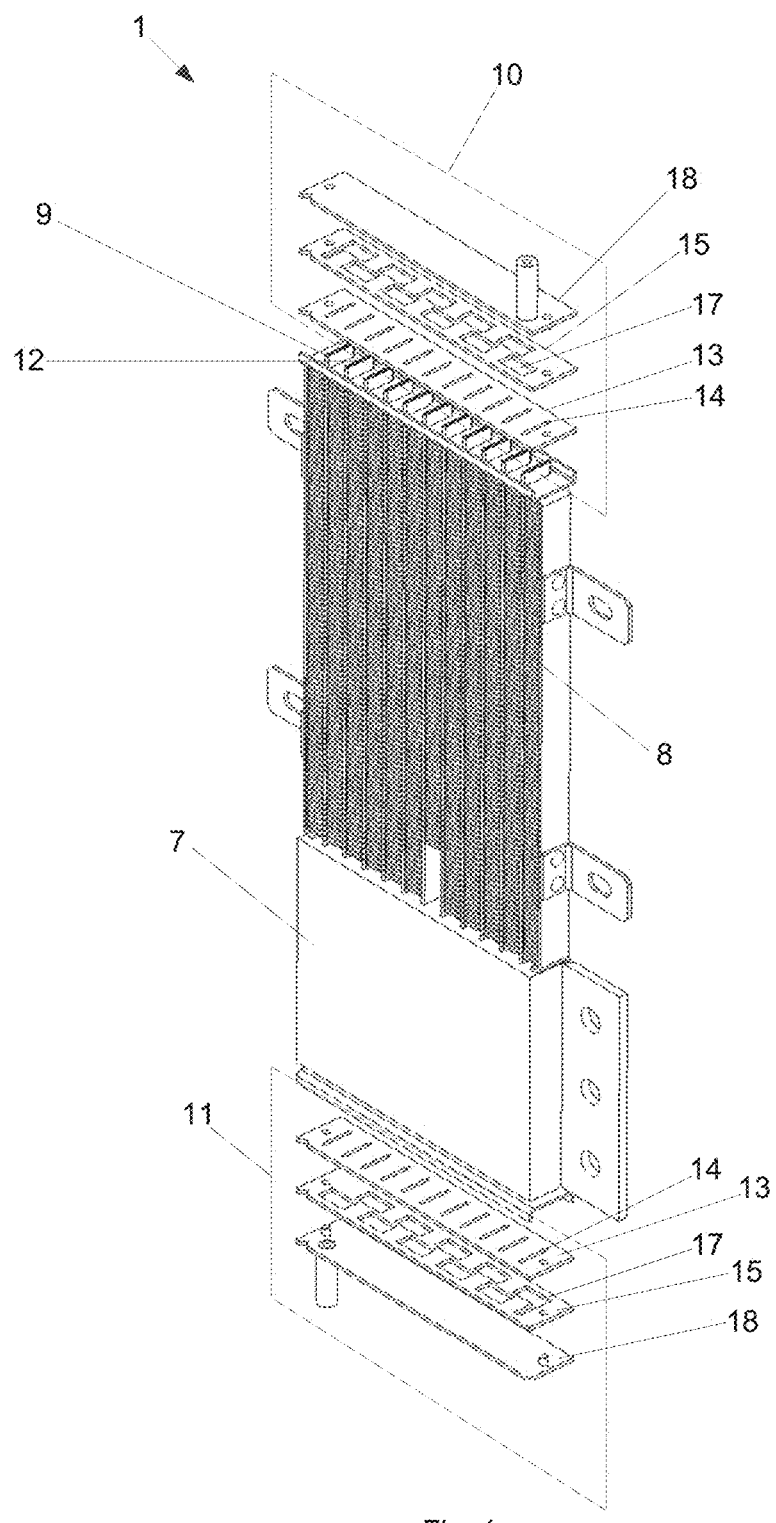
FIG. 1 schematically shows a heat exchange device according to a first embodiment of the invention.

FIG. 1 shows a first embodiment of the heat exchange device 1 based on a pulsating heat pipe comprising a plurality of pipes 9 to provide fluid paths between a first fluid distribution element 10 and a second fluid distribution element 11 of the heat exchange device 1. Each pipe 9 of the plurality of pipes 9 comprising a group of channels 12. Each of the first fluid distribution element 10 and the second fluid distribution element 11 comprises a plate 13 of a first type, wherein each of the plates 13 of the first type comprises openings 14. It should be further noted that each pipe may be a multiport extruded tube (MPE). Further, it should be noted that the plates 13 of the first type have an identical thickness.

The first fluid distribution element 10 comprises a plate 15 of a second type and wherein the plate 15 of the second type comprises openings 17 for providing fluid paths between the plurality of pipes 9. The plate 15 of the second type is positioned on a side of the plate 13 of the first type of the first fluid distribution element 10 that is opposite to the second fluid distribution element 11. The term "on a side" means on top or on the bottom.

According to FIG. 1, the plate 15 of the second type of the second fluid distribution element 11 is positioned on a side of the plate 13 of the first type of plates of the second fluid distribution element 11 that is opposite to the first fluid distribution element 10.

Each of the first fluid distribution element 10 and the second fluid distribution element 11 comprises a plate 18. The plate 18 has the function of sealing the fluid path or the heat exchange device 1.

According to FIG. 1, in the first fluid distribution element 10 the plate 18 is directly stacked on top of the plate 15 of the second type. According to FIG. 1, in the second fluid distribution element 11 the plate 18 is directly arranged below the plate 15 of the second type.

Further, the heat exchange device 1 according to FIG. 1 comprises a first heat transfer element 7 for transferring a heat load to a fluid in the plurality of pipes 9 and a second heat transfer element 8 for transferring a heat load from the fluid in the plurality of pipes 9 to an external cooling media. The first heat transfer element 7 is arranged in an end region of the first fluid distribution element 10. The second heat transfer element 8 is arranged on an opposite side of the first heat transfer element 7. The external cooling media could be for example an air flow (not displayed) that is directed to and from the heat exchange device 1.

The arrangement of the plurality of pipes 9 is usually in parallel, but it should be mentioned that the operation of the invention is not restricted to a certain arrangement the pipes 9.

According to the embodiment of FIG. 1, the openings 17 of the plate 15 of the second type are arranged in the plate 15 of the second type in a way that the center points of the openings 17 of the plate 15 of the second type are geometrically interconnected by a periodically formed zigzag line, wherein the periodically formed zigzag line comprises a plurality of corner points and wherein the center point of each opening 17 is lying upon a corner point of the plurality of corner points of the periodically formed zigzag line. However, other arrangements of the openings 17 of the plate 15 of the second type in the plate 15 of the second type are possible.

The plates 15 of the second type may have an identical thickness. Further, the thickness of the plates 15 of the second type may be identical to the thickness of the plates 13 of the first type.

The thickness of the plates 13 of the first type and/or the thickness of the plates 15 of the second type may be at least approximately identical to the thickness of a pipe 9. The thickness of the pipe 9 is herein defined as a width of the pipe 9, wherein the width of the pipe 9 is orthogonal both to a stacking direction of channels 12 of the pipe 9 and a fluid path direction of the pipe 9.

According to FIG. 1, in the first distribution element 10 the plate 13 of a first type and the plate 15 of a second type are directly stacked on top of each other.

According to FIG. 1, in the second fluid distribution element 11 the plate 13 of the first type and the plate 15 of the second type are directly stacked on top of each other.

Figure 2:
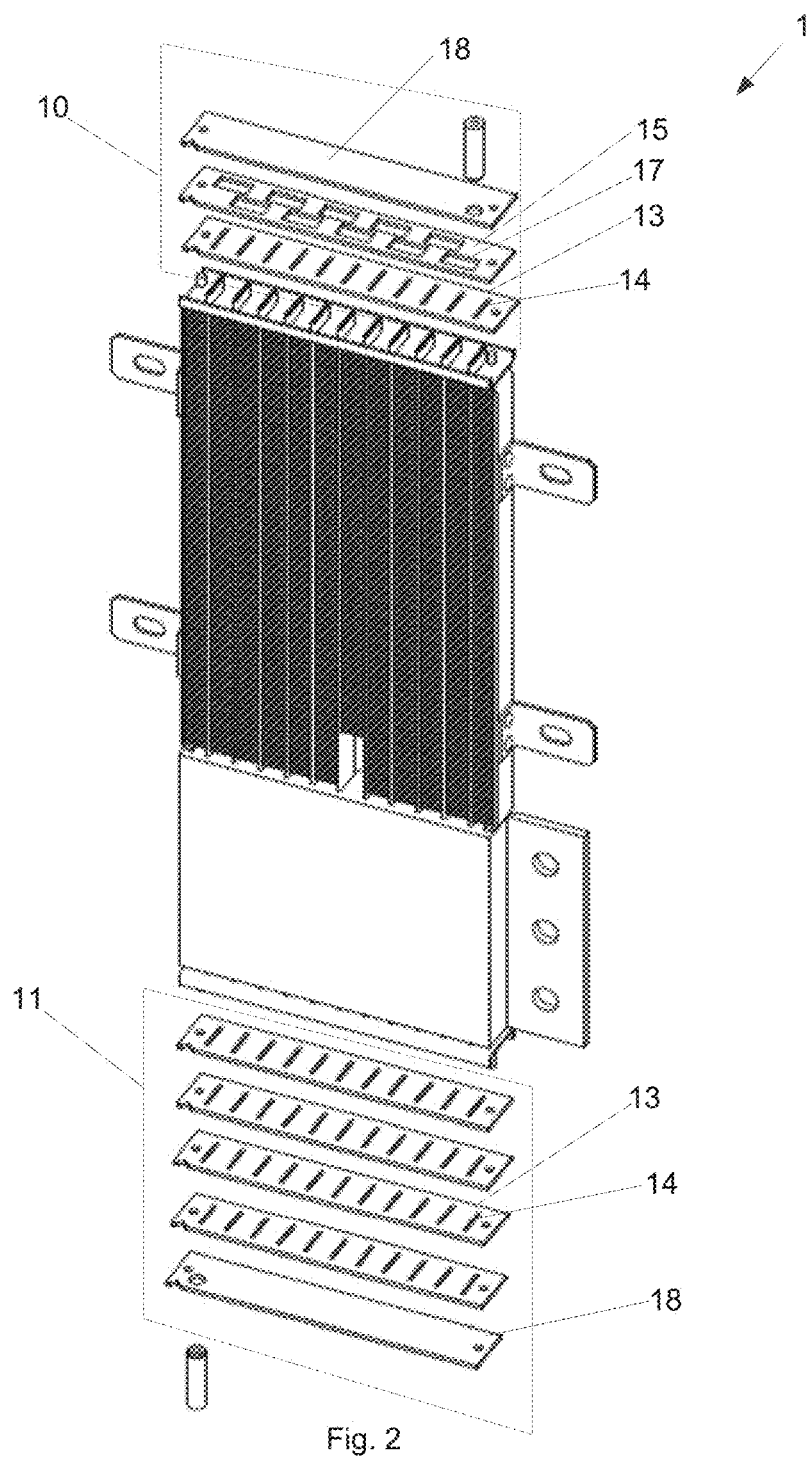
FIG. 2 schematically shows a heat exchange device according to a second embodiment of the invention.

FIG. 2 shows a second embodiment of a heat exchange device 1. The heat exchange device 1 is similar to the heat exchange device 1 as displayed in FIG. 1. The first fluid distribution element 10 of the heat exchange device in FIG. 2 comprises a plate 13 of a first type with openings 14 and a plate 15 of a second type with openings 17. The second fluid distribution element 11 of the heat exchange device 1 in FIG. 2 comprises a plurality of four plates 13 of the first type stacked on top of each other, wherein each of the plates 13 of the first type has identical openings 14. By using a plurality of plates 13 of the first type, it is possible to keep the flow area constant between the channels 12 of each pipe 9. The heat exchange device 1 as displayed in FIG. 1 and FIG. 2 is operated in an open loop configuration.

According to FIG. 2, in the second fluid distribution element 11 the plurality of plates 13 are directly stacked on top of each other.

According to FIG. 2, the first distribution element 10 comprises a plate 18, wherein the plate 18 is directly stacked on top of plate 15 of the second type. Further, according to FIG. 2, the second fluid distribution element 11 comprises a plate 18, wherein the plate 18 is directly arranged below the plates 13 of the first type.

Figure 3:
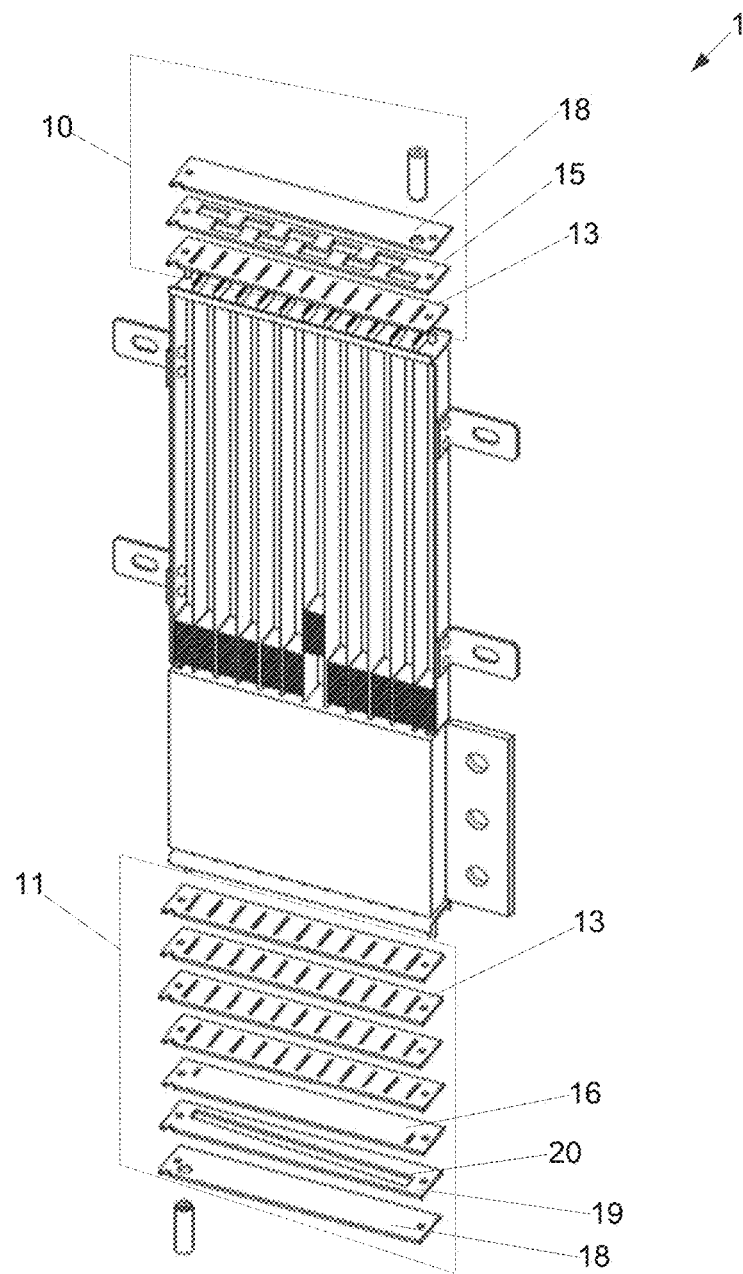
FIG. 3 schematically shows a heat exchange device according to a third embodiment of the invention.

FIG. 3 shows a third embodiment of the heat exchange device 1. The heat exchange device 1 differs from the second embodiment according to FIG. 2 only in the way that the second fluid distribution element 11 further comprises plates 16, 18 and 19. The plate 18 has the function of sealing the fluid path or the device 1. The plate 19 with an opening 20 enables to operate the heat exchange device 1 in a closed loop configuration. The opening 20 connects pipes 9 of the plurality of pipes 9 located on an opposite side of the second fluid distribution element 11. In case that the heat exchange device 1 needs to be operated in an open loop configuration, the plate 19 should be omitted.

Figure 4:
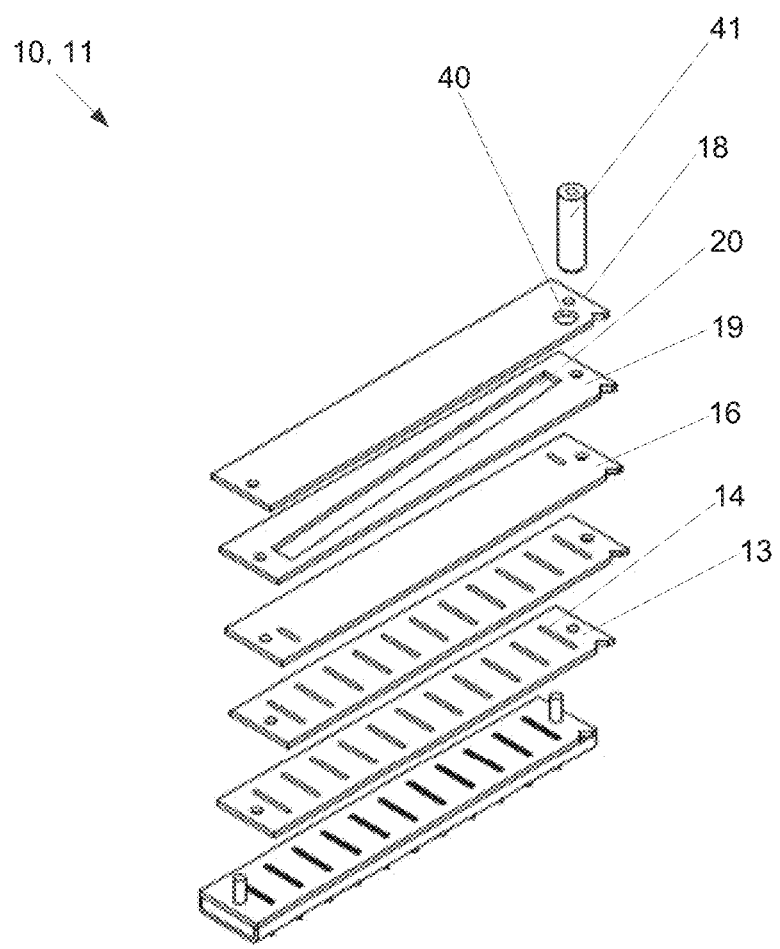
FIG. 4 schematically shows a structure of a fluid distribution element according to an embodiment of the invention.

FIG. 4 shows a fluid distribution element 10, 11 of a heat exchange device 1 comprising a plurality of plates stacked on top of each other. The fluid distribution element 10, 11 comprises a plate 13 of the first type and plates 16, 18 and 19. The plate 18 has the function of sealing the heat exchange device 1 (not displayed). Further, the plate 18 has an opening 40 for an inlet 41. The inlet 41 provides a charging point for the fluid. With the plate 19 with the opening 20 the heat exchange device 1 can be operated in a closed loop configuration.

Figure 5:
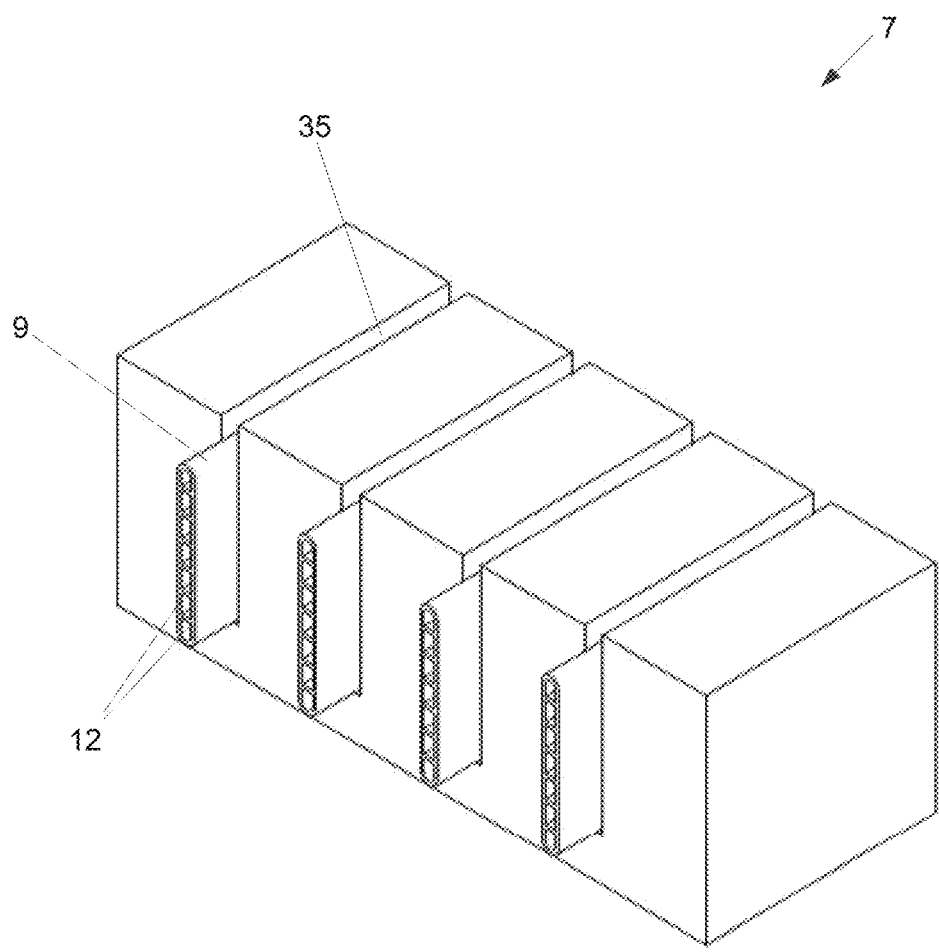
FIG. 5 schematically shows a detailed view of a part of a heat transfer element according to an embodiment of the invention.
Figure 6:
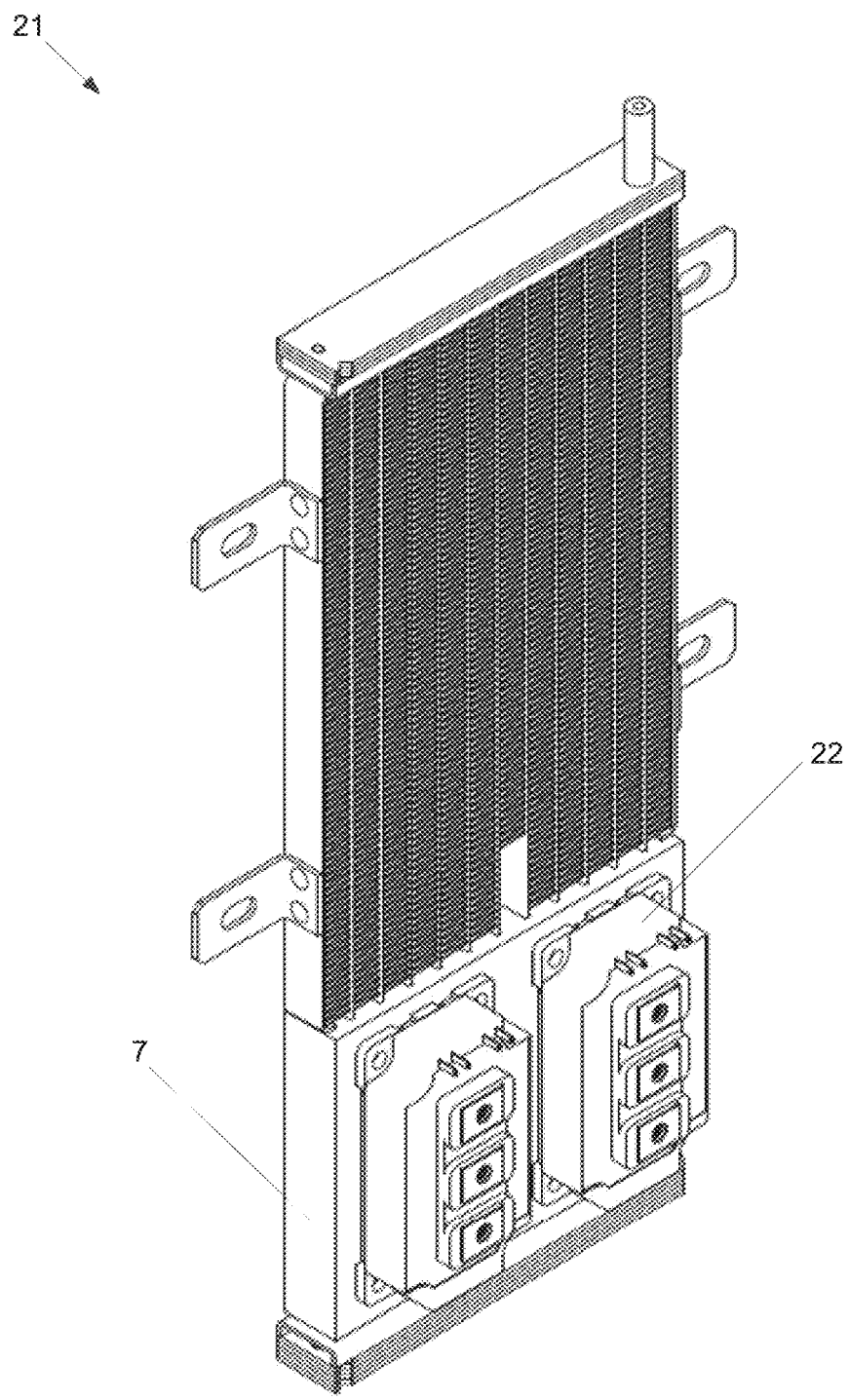
FIG. 6 schematically shows a first cooling arrangement for a heat exchange device according to the invention.

FIG. 5 shows a detailed view of a part of the first heat transfer element 7. The first heat transfer element 7 comprises a plurality of grooves 35 for receiving a part of the pipe 9 of the plurality of pipes 9 comprising a plurality of channels 12. The part of the pipe 9 is embedded into the groove 35 providing protection for the pipe 9. The plurality of grooves 35 are arranged inside the first heat transfer element 7. An advantage of the grooves 35 is illustrated by FIG. 6: When a plurality of heat exchange devices is arranged in a stack with elements, the pipes 9 that are embedded in the grooves 35 inside the first heat transfer element 7 are not damaged when for example a clamping means is applied to the stack (not displayed).

FIG. 6 shows a first example of an application of the heat exchange device 1. The cooling arrangement 21 may include two electronic components 22 mounted to the first heat transfer element 7 of the heat exchange device 1. The electronic components 22 may be semiconductor components such as IGBT or IGCT components or any other power semiconductor switching devices depending on the field of application.

Figure 7:
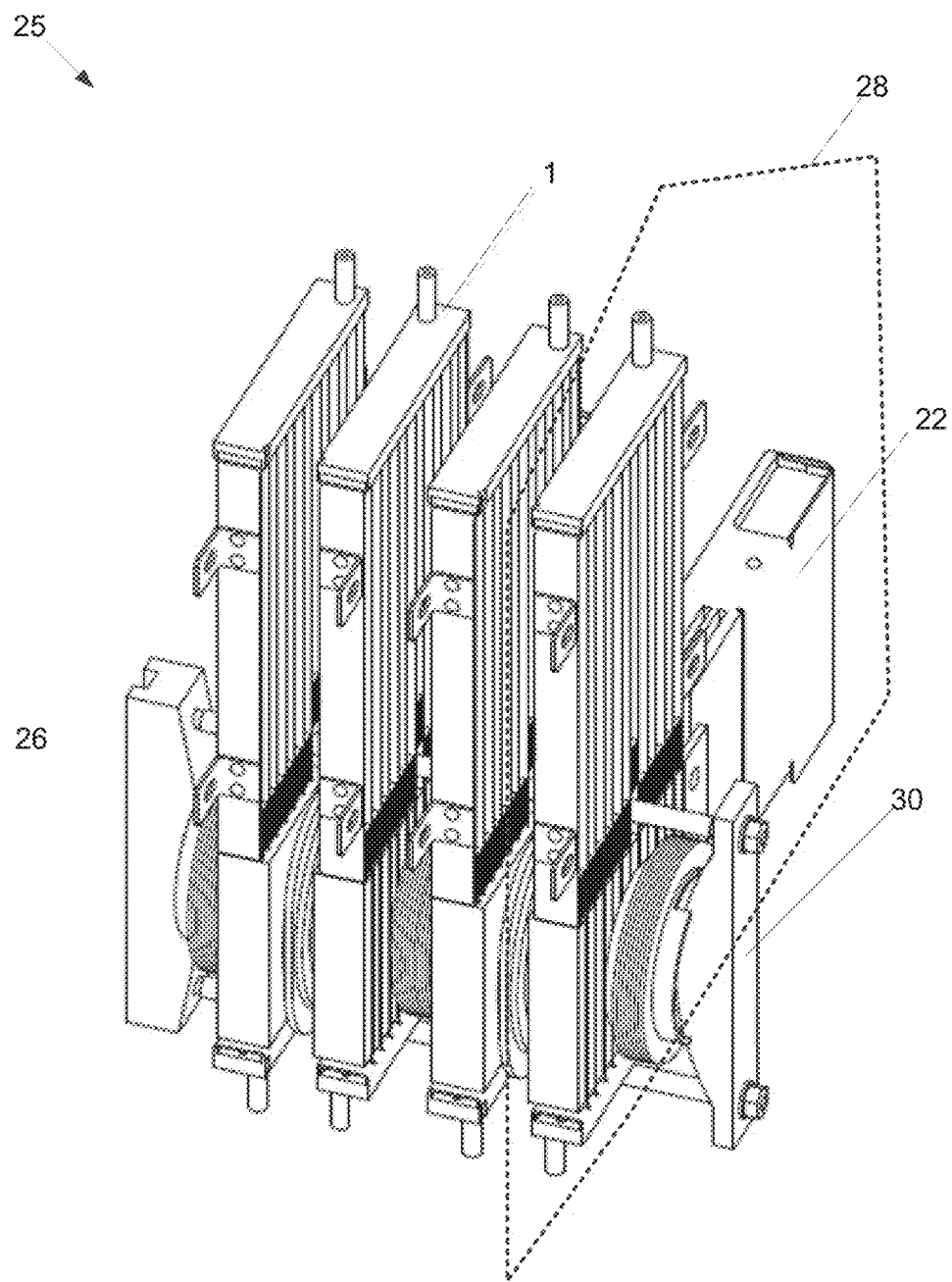
FIG. 7 schematically shows a second cooling arrangement for a heat exchange device according to the invention.

FIG. 7 shows a second example of an application of the heat exchange device 1. The cooling arrangement according to FIG. 7 comprises a plurality of heat exchange devices 1 being arranged in a stack assembly. The cooling arrangement 25 comprises four units 28, wherein each unit 28 comprises one heat exchange device 1, a switching device 22. The switching device 22 is in a physical contact with the heat exchange device 1 for transferring a heat load from the switching device 22 to the heat exchange device 1. Such a configuration may be used by cooling direct current circuit breakers based on IGBT or IGCT components. The stack assembly is clamped by a clamp 30. In some embodiments, the cooling arrangement 25 may further include an electric isolator element 26 provided between two units 28 located next to each other.

According to an embodiment of the invention, the second fluid distribution element comprises a plurality of plates of the first type, wherein the plates of the first type are stacked on top of each other and wherein the openings of the first type further provide a constant area flow passage between the group of channels of each pipe. The possibility to stack a plurality of plates of the first type has the advantage that the quality of cooling by the heat exchange device can be individually and easily adapted to the cooling requirements of the field of application. Further, the plurality of plates of the first type are preferably identical geometrically shaped.

According to a further embodiment of the invention, in the second fluid distribution element the plurality of plates of the first type are directly stacked on top of each other.

According to a further embodiment of the invention, the second fluid distribution element comprises a plate of the second type, wherein the plate of the second type comprises openings. This has the advantage of providing a constant area flow passage along the fluid path between channels of adjacent pipes.

According to a further embodiment of the invention, the openings of the plate of the second type are arranged in the plate of the second type in a way that the center points of the openings of the plate of the second type are geometrically interconnected by a periodically formed zigzag line, wherein the periodically formed zigzag line comprises a plurality of corner points and wherein the center point of each opening is lying upon a corner point of the plurality of corner points of the periodically formed zigzag line.

According to a further embodiment of the invention, the plate of the second type of the second fluid distribution element is positioned on a side of the plate of the first type of plates of the second fluid distribution element that is opposite to the first fluid distribution element.

According to a further embodiment of the invention, the plates of the first type may have an identical thickness. In another embodiment of the invention, the plates of the first type and the plates of the second type may have an identical thickness.

According to a further embodiment of the invention, the first fluid distribution element and/or the second fluid distribution element comprises at least one cover plate for closing the fluid path. A cover plate or a plurality of cover plates stacked on top of each other prevents leakage of cooling liquid. Further, the cover plate may have an opening for an inlet that can be used to introduce or to omit a cooling media.

According to a further embodiment of the invention, the plurality of pipes are arranged in parallel. However, the arrangement of the pipes is not restricted to a parallel orientation. Other orientations might be possible and do not restrict the herein described positive effects of the present invention.

According to a further embodiment of the invention, the heat exchange device comprises a first heat transfer element for transferring a heat load to a fluid in the plurality of pipes and a second heat transfer element for transferring a heat load from the fluid in the plurality of pipes to an external cooling media, wherein the first heat transfer element is arranged in an end region of the first fluid distribution element or in an end region of the second fluid distribution element and wherein the second heat transfer element is arranged on an opposite side of the first heat transfer element. The external cooling media could be for example an air flow that is directed to and from the heat exchange device.

According to a further embodiment of the invention, the first heat transfer element comprises a plurality of grooves for receiving a part of the pipe of the plurality of pipes that the part of the pipe is completely embedded in the groove. The plurality of grooves are arranged inside the first heat transfer element. It should be noted that in a preferred embodiment of the present invention all pipes are embedded. An advantage of the grooves can be illustrated by the following useful application of the heat exchange device: When a plurality of heat exchange devices is arranged in a stack with elements, the pipes that are embedded in the grooves inside the first heat transfer element are not damaged when for example a clamping means is applied to the stack.

According to a further embodiment of the invention, the first fluid distribution element or the second fluid distribution element comprises at least two plates with openings for connecting pipes of the plurality of pipes located on an opposite side of the first distribution element or the second fluid distribution element. This has the advantage that the heat exchange device can also be operated in a closed loop mode.

According to a further embodiment of the invention, the plates of the second type have an identical thickness.

According to a further embodiment of the invention, the thickness of the plates of the second type is identical to the thickness of the plates of the first type.

According to a further embodiment of the invention, the thickness of the plates of the first type and/or the thickness of the plates of the second type is at least approximately identical to the thickness of a pipe, wherein the thickness of the pipe is defined as a width of the pipe, wherein the width of the pipe is orthogonal both to a stacking direction of channels of the pipe and a fluid path direction of the pipe.

According to a further embodiment of the invention, in the first fluid distribution element the at least one plate of the first type and the plate of the second type are directly stacked on top of each other.

According to a further embodiment of the invention, in the second fluid distribution element the at least one plate of the first type and the plate of the second type are directly stacked on top of each other.

According to a further embodiment of the invention, a first cooling arrangement can be configured, wherein the cooling arrangement comprises at least one heat exchange device, at least one switching device and wherein the switching device is in physical contact with the at least one heat exchange device for transferring a heat load from the switching device to the at least one heat exchange device. Such a cooling arrangement may be built by mounting a power semiconductor device such as an IGCT, an IGBT component or any other power semiconductor switching device on the heat exchange device.

According to a further embodiment of the invention, a second cooling arrangement can be configured comprising a plurality of units which are mechanically coupled with each other, wherein each unit comprises at least one heat exchange device, at least one switching device, and wherein the switching device is in physical contact with the at least one heat exchange device for transferring a heat load from the switching device to the at least one heat exchange device and wherein an electric isolator element is provided between two units located next to each other. Such cooling arrangements may be used for direct current circuit breaker applications based on power semiconductor switching devices.

Thus, although there have been described particular embodiments of the present invention of a new and useful HEAT EXCHANGE DEVICE BASED ON A PULSATING HEAT PIPE it is not intended that such references be construed as limitations upon the scope of this invention except as set forth in the following claims.

What is claimed is:

1. A heat exchange device based on a pulsating heat pipe comprising a plurality of pipes to provide fluid paths between a first fluid distribution element and a second fluid distribution element of the heat exchange device, wherein each pipe of the plurality of pipes comprises a group of channels, characterized in that:
   each of the first fluid distribution element and the second fluid distribution element comprises at least a plate of a first type, wherein each plate of the first type comprises openings for providing an alignment functionality for the plurality of pipes, and wherein the plates of the first type have an identical thickness;
   wherein the first fluid distribution element comprises a plate of a second type, and wherein the plate of the second type comprises openings for providing fluid paths between the plurality of pipes, and wherein the plate of the second type is positioned on a side of the plate of the first type of plates of the first fluid distribution element that is opposite to the second fluid distribution element;
   wherein the heat exchange device is included in a cooling arrangement, characterized in that the cooling arrangement comprises a plurality of units which are mechanically coupled with each other, wherein each unit comprises at least one heat exchange device and at least one switching device;
   wherein the switching device is in physical contact with the at least one heat exchange device for transferring a heat load from the switching device to the at least one heat exchange device; and
   wherein an electric isolator element is provided between two units located next to each other.

2. The heat exchange device according to claim 1, further characterized in that the second fluid distribution element comprises a plurality of plates of the first type, wherein the plates of the first type are stacked on top of each other and wherein the openings of plates of the first type further provide a constant area flow passage between the group of channels of each pipe.

3. The heat exchange device according to claim 2, further characterized in that in the second fluid distribution element the plurality of plates of the first type are directly stacked on top of each other.

4. The heat exchange device according to claim 1, further characterized in that the second fluid distribution element comprises a plate of the second type, wherein the plate of the second type comprises openings for providing a constant area flow passage along the fluid paths between channels of adjacent pipes.

5. The heat exchange device according to claim 4, further characterized in that:
   the openings of the plate of the second type are arranged in the plate of the second type in a way that center points of the openings of the plate of the second type are geometrically interconnected by a periodically formed zigzag line; and
   wherein the periodically formed zigzag line comprises a plurality of corner points and wherein a center point of each opening is lying upon a corner point of the plurality of corner points of the periodically formed zigzag line.

6. The heat exchange device according to claim 4, further characterized in that the plate of the second type of the second fluid distribution element is positioned on a side of the plate of the first type of plates of the second fluid distribution element that is opposite to the first fluid distribution element.

7. The heat exchange device according to claim 4, further characterized in that in the second fluid distribution element the at least one plate of the first type and the plate of the second type are directly stacked on top of each other.

8. The heat exchange device according to claim 1, further characterized in that at least one of the first fluid distribution element and the second fluid distribution element comprises at least one cover plate for closing the fluid paths.

9. The heat exchange device according to claim 1, further characterized in that the plurality of pipes are arranged in parallel.

10. The heat exchange device according to claim 1, further characterized in that the heat exchange device comprises:
   a first heat transfer element for transferring a heat load to a fluid in the plurality of pipes;
   a second heat transfer element for transferring a heat load from the fluid in the plurality of pipes to an external cooling media;
   wherein the first heat transfer element is arranged in an end region of the first fluid distribution element or in an end region of the second fluid distribution element; and wherein the second heat transfer element is arranged on an opposite side of the first heat transfer element.

11. The heat exchange device according to claim 10, further characterized in that the first heat transfer element comprises a plurality of grooves for receiving a part of the pipe of the plurality of pipes that the part of the pipe is completely embedded in the groove.

12. The heat exchange device according to claim 1, further characterized in that one of the first fluid distribution element and the second fluid distribution element comprises at least two plates with openings for connecting pipes of the plurality of pipes located on an opposite side of another of the first distribution element and the second fluid distribution element for operating the heat exchange device in a closed loop mode.

13. The heat exchange device according to claim 4, further characterized in that the plates of the second type have an identical thickness.

14. The heat exchange device according to claim 13, further characterized in that the thickness of the plates of the second type is identical to the thickness of the plate of the first type.

15. The heat exchange device according to claim 4, further characterized in that:
at least one of a thickness of the plates of the first type and a thickness of the plates of the second type is at least approximately identical to a thickness of a pipe of the plurality of pipes;
wherein the thickness of the pipe is defined as a width of the pipe; and
wherein the width of the pipe is orthogonal both to a stacking direction of the channels of the plurality of pipes and a fluid path direction of the pipe.

16. The heat exchange device according to claim 1, further characterized in that in the first distribution element the at least one plate of the first type and the plate of the second type are directly stacked on top of each other.

17. A cooling arrangement comprising:
a plurality of units mechanically coupled with each other, each unit further comprising at least one heat exchange device and at least one switching device, wherein the switching device is in physical contact with the at least one heat exchange device for transferring a heat load from the switching device to the at least one heat exchange device, and wherein an electric isolator element is provided between two units located next to each other;
each heat exchange device based on a pulsating heat pipe comprising a plurality of pipes to provide fluid paths between a first fluid distribution element and a second fluid distribution element;
wherein each of the first fluid distribution element and the second fluid distribution element comprises at least a plate of a first type, wherein each plate of the first type comprises openings for providing an alignment functionality for the plurality of pipes; and
wherein the first fluid distribution element comprises a plate of a second type, and wherein the plate of the second type comprises openings for providing fluid paths between the plurality of pipes, and wherein the plate of the second type is positioned on a side of the plate of the first type of plates of the first fluid distribution element that is opposite to the second fluid distribution element.

18. The cooling arrangement of claim 17, wherein:
each pipe of the plurality of pipes comprises a group of channels;
the second fluid distribution element comprises a plurality of plates of the first type stacked on top of each other; and
wherein the openings of plates of the first type further provide a constant area flow passage between the group of channels of each pipe.

19. The cooling arrangement of claim 17, wherein:
each pipe of the plurality of pipes comprises a group of channels;
the second fluid distribution element comprises a plate of the second type, wherein the plate of the second type comprises openings for providing a constant area flow passage along the fluid paths between channels of adjacent pipes; and
the plate of the second type of the second fluid distribution element is positioned on a side of the plate of the first type of plates of the second fluid distribution element that is opposite to the first fluid distribution element.

20. The cooling arrangement of claim 17, wherein:
each pipe of the plurality of pipes comprises a group of channels;
the second fluid distribution element comprises a plate of the second type, wherein the plate of the second type comprises openings for providing a constant area flow passage along the fluid paths between channels of adjacent pipes; and
in the second fluid distribution element the at least one plate of the first type and the plate of the second type are directly stacked on top of each other.

* * * * *